(12) United States Patent
Cave et al.

(10) Patent No.: US 6,232,235 B1
(45) Date of Patent: *May 15, 2001

(54) METHOD OF FORMING A SEMICONDUCTOR DEVICE

(75) Inventors: Nigel Graeme Cave; Matthew Thomas Herrick; Terry Grant Sparks, all of Austin, TX (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/089,720

(22) Filed: Jun. 3, 1998

(51) Int. Cl.$^7$ .............................. H01L 23/58; H01L 21/00
(52) U.S. Cl. ........................... 438/715; 438/623; 438/736
(58) Field of Search .................................... 438/623, 715, 438/736

(56) References Cited

U.S. PATENT DOCUMENTS

| | | | |
|---|---|---|---|
| 5,565,384 | * 10/1996 | Havemann | 437/228 |
| 5,597,764 | * 1/1997 | Koh et al. | 437/195 |
| 5,646,440 | * 7/1997 | Hasegawa | 257/635 |
| 5,679,608 | * 10/1997 | Cheung et al. | 437/195 |
| 5,880,018 | 3/1999 | Boeck et al. | 438/619 |
| 5,920,790 | 7/1999 | Wetzel et al. | 438/618 |

OTHER PUBLICATIONS

U.S. application No. 08/868,332, Wetzel, filed Jun. 2, 1997.

* cited by examiner

*Primary Examiner*—Randy Gulakowski
*Assistant Examiner*—Shamim Ahmed
(74) *Attorney, Agent, or Firm*—George R. Meyer

(57) ABSTRACT

In one embodiment, a first dielectric film (24), and a second dielectric film (32) are formed over a substrate (10). The substrate is cured to at least partially change a property of the second dielectric film thereby forming an intermediate etch stop (46). A third dielectric film (42) is formed over the substrate (10). The substrate (10) is then etched to remove portions of the first dielectric film (24) and portions of the third dielectric film (42) using the intermediate etch stop (46) to form a portion of an interconnect opening (103). In an alternative embodiment, a resist layer (92), and portions of an interlevel dielectric layer (50) are etched. Upon completion of the step of etching, the photoresist layer (92) and portions of the interlevel dielectric layer (50) are completely removed.

21 Claims, 5 Drawing Sheets

METHOD OF FORMING A SEMICONDUCTOR DEVICE

FIELD OF THE INVENTION

The present invention relates to semiconductor devices, and in particular, to forming low dielectric constant inter-level dielectric layers for those devices.

BACKGROUND OF THE INVENTION

Semiconductor devices are continuing to being scaled to smaller dimensions. Copper interconnects and low dielectric constant (low-k) materials are two areas of technology that are being developed by semiconductor device manufacturers in an effort to reduce device dimensions. A film's dielectric constant is a measure of its electrical insulating value. Air has a dielectric constant, or k value equal to one. Commonly used silicon dioxide ($SiO_2$), by comparison, has a dielectric constant of approximately 4.0. For the purposes of this specification, a low-k material is any material having a dielectric constant less than approximately 3.5.

In one particular interconnect scheme, a dual inlaid structure is formed. After forming a first interconnect level, an interlevel dielectric (ILD) layer having a dual inlaid opening is formed. One prior art technique uses three relatively high dielectric constant hardmask films with low-k dielectric films layered between them. The dual inlaid structure is formed by opening a via and a trench in the dielectric films using a "via first, trench last" or "trench first, via last" processing sequence. Following these steps, an interconnect structure is formed within the trench and the via opening.

One problem with the prior art includes its use of chemically vapor deposited silicon nitride materials including plasma enhanced silicon nitride or silicon oxynitride compounds to form the hardmask. These materials have a relatively high dielectric constant (i.e., greater than five) that increases the total dielectric constant of the ILD layer and raises the total capacitance within the structure. Another problem with the prior art is that the top hardmask film is susceptible to erosion when forming the trench and the via openings. If the hardmask is eroded to a point where the underlying low-k dielectric is exposed during the trench or via etch, the low-k dielectric film will begin to etch laterally resulting in wider than specified feature sizes.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION OF THE DRAWINGS

In one embodiment, a first dielectric film, and a second dielectric film are formed over a substrate. The substrate is cured to at least partially change a property of the second dielectric film thereby forming an intermediate etch stop. A third dielectric film is formed over the substrate. The substrate is then etched to remove portions of the first dielectric film and portions of the third dielectric film using the intermediate etch stop to form a portion of an interconnect opening.

In an alternative embodiment, a resist layer, and portions of an interlevel dielectric layer are etched. Upon completion of the step of etching, the photoresist layer and portions of the interlevel dielectric layer are completely removed.

Figure 1:
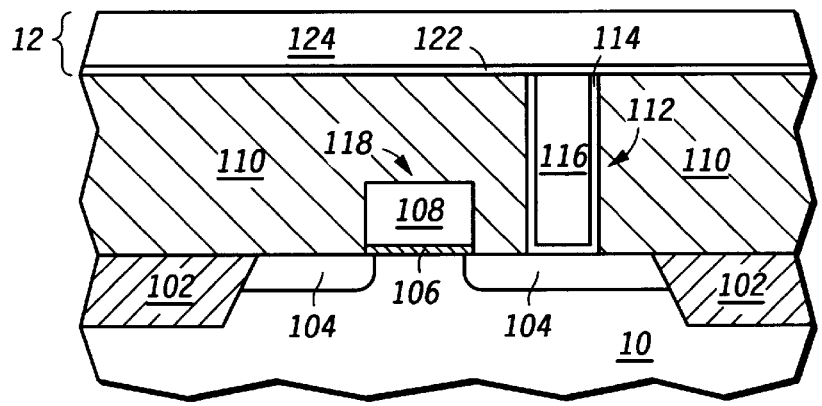
FIG. 1 includes an illustration of a cross-sectional view of a portion of a semiconductor device substrate after forming a first interconnect layer.

FIG. 1 includes an illustration of a semiconductor device that has been partially processed to define a first interconnect level. The semiconductor device comprises a semiconductor device substrate 10, field isolation regions 102, a transistor 118, conductive plug 112, and a dielectric layer 110. Transistor 118 comprises doped regions 104, a gate dielectric layer 106, and a gate electrode 108. As used in this specification, the semiconductor device substrate 10 comprises a monocrystalline semiconductor wafer, a semiconductor-on-insulator substrate, or any other substrate used to form a semiconductor device.

In one embodiment the gate electrode 108 is a layer of polysilicon. Alternatively, gate electrode 108 may be a metal layer, such as tungsten or molybdenum, a metal nitride layer such as titanium nitride or tungsten nitride, or a combination thereof. In addition gate electrode 108 may be a polycide layer comprising a metal silicide, such as tungsten silicide, titanium silicide, or cobalt silicide, overlying a polysilicon layer.

Following formation of the gate electrode 108, a first interlevel dielectric (ILD) film 110 is formed over the substrate 10 and patterned to form a contact opening. In one embodiment, first ILD film 110 is a layer of plasma deposited oxide which is formed using tetraethoxysilane (TEOS) as a source gas. Alternatively, first ILD film 110 may be a layer of silicon nitride, a layer of phosphosilicate glass (PSG), a layer of borophosphosilicate glass (BPSG), a silicon oxynitride layer, a polyimide layer, a low-k dielectric, or a combination thereof.

Following patterning, a contact opening is formed in the dielectric layer 110. The contact opening comprises a conductive plug 112 that is formed using an adhesion/barrier film 114, such as titanium/titanium nitride (Ti/TiN) or tantalum/tantalum nitride (Ta/TaN) and a conductive fill material 116, such as tungsten. After being deposited, portions of the conductive fill material 116 and underlying adhesion/barrier film 114 are removed using a conventional etching or chemical-mechanical polishing technique to form the conductive plug 112. Alternatively, the conductive plug 112 may be formed using doped silicon as a contact fill material with or without the barrier film 114.

After forming the conductive plug 112, a second adhesion/barrier film 122 and a second conductive film 124 are formed overlying the conductive plug 112 and dielectric layer 110. In one embodiment the second adhesion/barrier layer 122 is formed using a Ta/TaN barrier layer and conductive film 124 is formed using copper, aluminum, or the like. The combination of the second adhesion/barrier film 122 and the second conductive film 124 form the first interconnect level 12. Up to this point in the process, conventional methods have been used to form the device as shown in FIG. 1.

Figure 2:
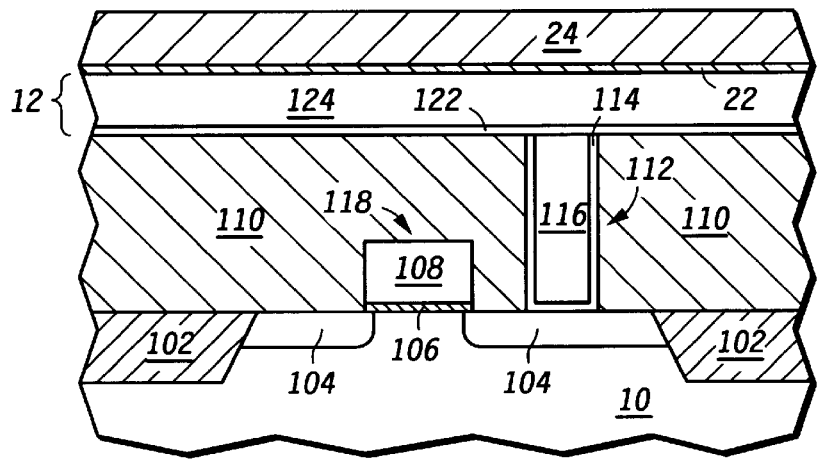
FIG. 2 includes an illustration of a cross-sectional view of the substrate of FIG. 1 after forming a first hardmask film and a first low-k dielectric film.

In FIG. 2, a bottom etch stop film 22 and a first low-k dielectric film 24 are formed over the second conductive film 124. In one embodiment, etch stop film 22 includes a layer of plasma enhanced nitride, which is formed using conventional plasma deposition techniques. Alternatively, the etch stop film 22 may comprise silicon oxynitride, boron nitride, or the like. The first low-k dielectric film 24 overlies the bottom etch stop film 22 and may be formed using coating or chemical vapor deposition processes. The first low-k dielectric film 24 may be formed using a polyimide, biscyclobutene, a fluorocarbon, a polyarylether-based material, a spin-on glass, a porous oxide material, such as an aerogel, a xerogel, a paralyene, a carbon-containing silicon oxide, or the like.

Figure 3:
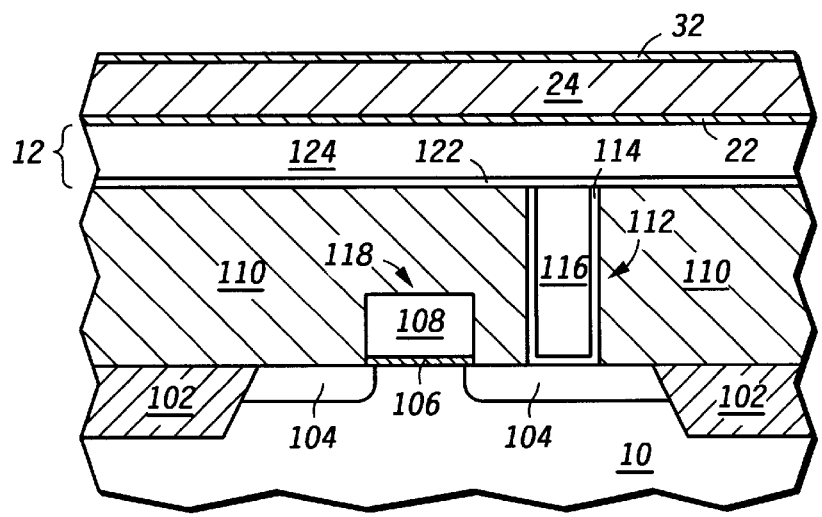
FIG. 3 includes an illustration of a cross-sectional view of FIG. 2 after forming a second hardmask film that is coated over the first low-k dielectric film in accordance with an embodiment of the present invention.

In FIG. 3, in accordance with an embodiment of the present invention, an organosilicon film 32 is formed over the first low-k dielectric film 24. In general, the organosilicon film 32 is formed from a compound having a molecular formula of R—Si—R'$_3$. The R' group is a hydrocarbon derivative leaving group typically comprising a methoxy (—OCH$_3$) group, an ethoxy (—OC$_2$H$_5$) group, or the like. Typically, the R' group is directly bonded to the silicon atom.

The R group is also attached to the silicon atom. The R group typically contains a short hydrocarbon chain with a terminal functionality specifically selected to react with the dielectric material of the low-k dielectric film 24. The R group includes amino (—NH2) groups, hydroxyl (—OH) groups, vinyl (—CH=CH2) groups, or the like. For example, an amino group would be selected to react with a polyimide film or a vinyl group would be selected to react with a biscyclobutene film.

In one embodiment, the organosilicon material is initially a trimethoxy organoprecursor. Upon exposure to water, a chemical equilibrium condition occurs whereby the trimethoxy organoprecursor is converted to form a trihydroxy compound as shown by the equilibrium reaction equation below.

R—Si—(OCH$_3$)$_3$+3H$_2$O↔R—Si—(OH)$_3$+3CH$_3$OH

After being applied, the R group on the trihydroxy compound (R—Si—(OH)$_3$) then reacts with the low-k dielectric film 24 to form an intermediate organosilicon film.

The intermediate organosilicon film is coated over substrate 10 at a thickness in range of approximately 5–200 nanometers, more typically, this thickness is in a range of approximately 15–60 nanometers. After the coating step, the substrate is thermally processed in a range of approximately 250–350° C. to convert the trihydroxy compound into a polysiloxane compound with the evolution of water as generally shown by the unbalanced reaction equation below to form the organosilicon film 32. The overall reaction rate is influenced by the thermal processing temperature. At 350° C., the conversion to the polysiloxane proceeds rapidly.

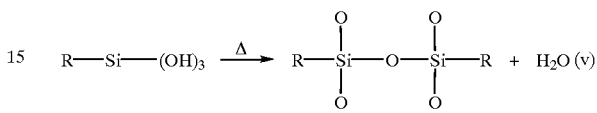

Figure 4:
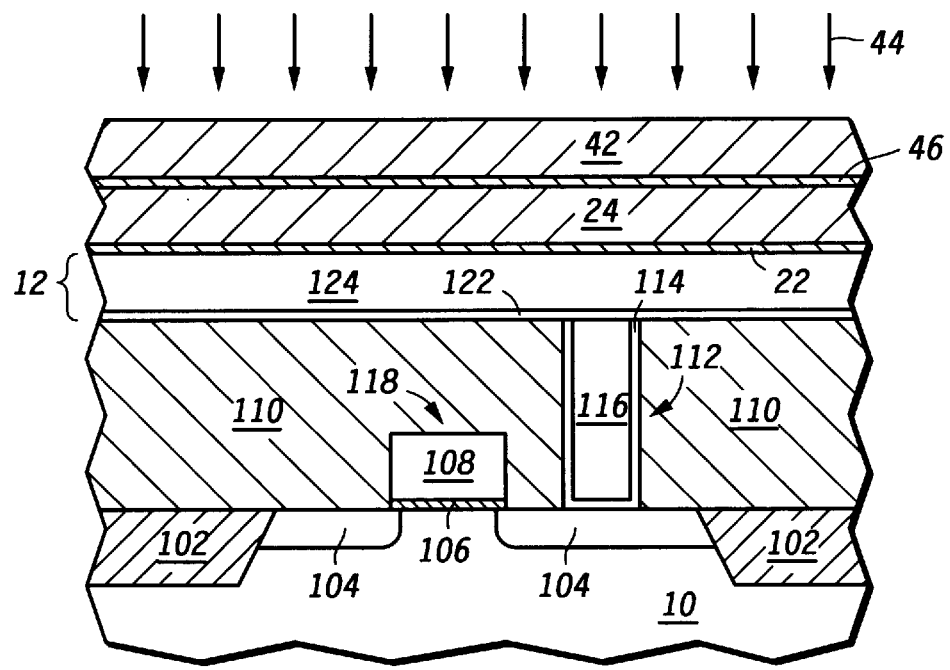
FIG. 4 includes an illustration of a cross-sectional view of the substrate of FIG. 3 during a heating cycle after depositing a second dielectric film in accordance with an embodiment of the present invention.

In FIG. 4, a second low-k dielectric film 42 is formed over the low-k dielectric fim 24. In one embodiment, the low-k dielectric film 42 is formed using any of the methods used to form low-k dielectric film 24. Alternatively, low-k dielectric film 42 can comprise the same or different materials than those used to form low-k dielectric film 24.

The substrate 10 is heated (cured) as illustrated by the arrows 44. The thermal processing temperature is generally in a range of approximately 250–500° C. The thermal processing time is typically in a range of approximately 2–60 minutes and is a function of the composition of low-k dielectric material deposited, and the type of processing equipment used to perform the curing operation (furnace versus hot plate). For example, requirements with respect to the film's thickness, solvent content, polymer crosslinking, and presence of other thermally sensitive materials, will all contribute to the determination of the cure time and temperature. Additionally, equipment availability, cost and convenience will all influence the selection of the equipment used to perform the cure.

If the thermal processing step is performed as part of a track operation, cure time is typically in a range of approximately 3–10 minutes. Relatively inert ambients, such as argon, helium, nitrogen, and the like, are used to reduce the likelihood of oxidizing the low-k dielectric film 42 and the previously deposited metallization. Furnace or oven based processes can be performed using an inert ambient or under vacuum conditions. This step is typically performed at a higher temperature than the temperature used to convert the hydrolyzed silane to a polysiloxane compound to form the organosilicon film 32 (illustrated in FIG. 3), and it results in the formation of a thin oxide-like film 46 (intermediate etch stop illustrated in FIG. 4) having a molecular composition SiO$_x$R$_y$, where x is equal to or greater than one, and y is equal to or greater than zero, such that x+y equals two.

Using temperature to control the stoichiometry of the x and y components also permits tailoring of the etchstop to allow integration with different dielectric films. For example, for use with carbon-based films, x may be two and y may be zero. However, in the case of silicon-based films, additional carbon may be needed to provide the required etchstop properties. In this case, the relative concentrations of the y constituents can be increased, and the x constituents can be decreased by varying temperature of the thermal processing step. The unbalanced reaction and structural formula for a silicon oxide-like film is generally represented as follows.

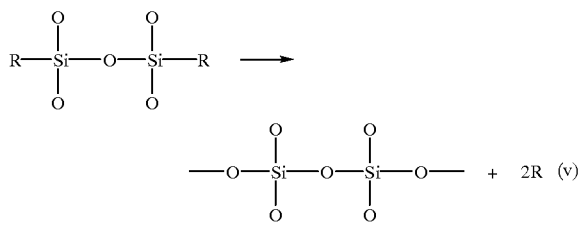

The curing step performs at least two functions. The first of which converts the polysiloxane to the oxide-like film 46, which is essentially a silicon oxide having a molecular composition $SiO_xR_y$, where x is equal to or greater than one, and y is equal to or greater than zero. The other of which cures both the low-k dielectric film 24 and the low-k dielectric film 42. The temperature used to perform this step is typically dictated by the temperature necessary to properly cure both low-k dielectric films 24 and 42. The oxide-like film 46 provides a thin intermediate etch stop film that permits proper trench and via patterning.

In alternate embodiments, a silicon-containing oxide such as a hydrogen-silsesquioxane (HSQ) or a hydrido-organosiloxane polymer (HSOP), or a carbon-based material, such as a polyimide or a polyarylether, can be used to form the intermediate etchstop film for the ILD layer 50. These materials may be capable of reducing the overall dielectric constant of ILD layer 50 and also provide the etch selectivity required to form the via opening in the lower film 52.

Figure 5:
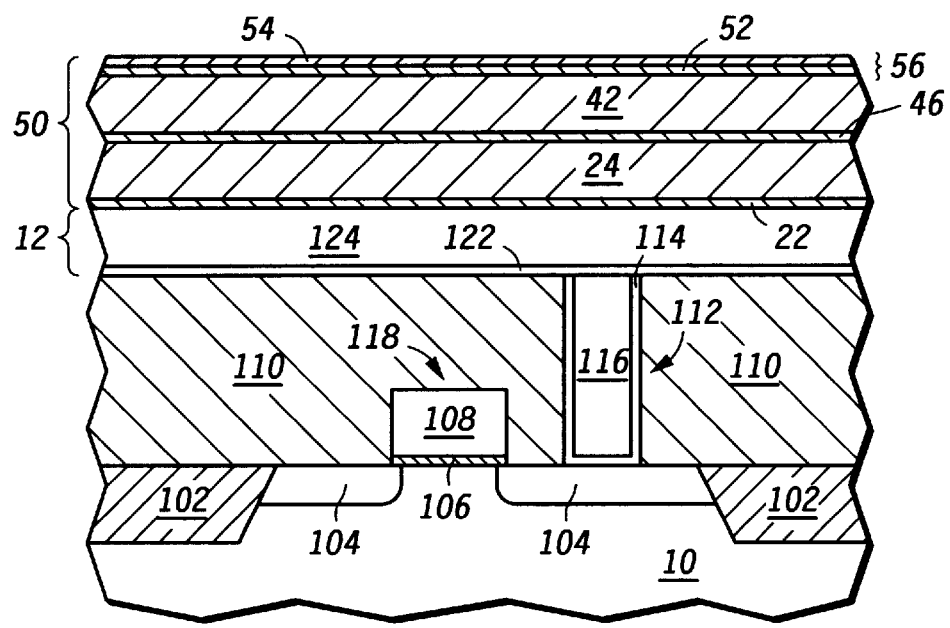
FIG. 5 includes an illustration of a cross-sectional view of the substrate of FIG. 4 after forming the third hardmask film in accordance with an embodiment of the present invention.

In FIG. 5, a hardmask film 56 is formed overlying the second low-k dielectric film 42. The hardmask comprises a lower film 52 and an upper film 54. In this particular embodiment, the lower film 52 is a layer of silicon nitride, such as plasma enhanced silicon nitride, silicon oxynitride, or the like. Alternatively, the lower film 52 may be a fluorinated silicon oxide, which has a lower dielectric constant compared to silicon dioxide. The upper film 54 includes amorphous or polycrystalline silicon. The lower film 52 typically has a thickness in a range of approximately 5–100 nanometers, and upper film 54 typically has thickness in range of approximately 5–20 nanometers. Generally, the overall thickness of the hardmask film 56 should be kept as thin as possible while retaining its properties as a hardmask during subsequent via and trench formation steps. The combination of the films 22, 24, 42, 46, 52, and 54 form the interlevel dielectric (ILD) layer 50.

Figure 6:
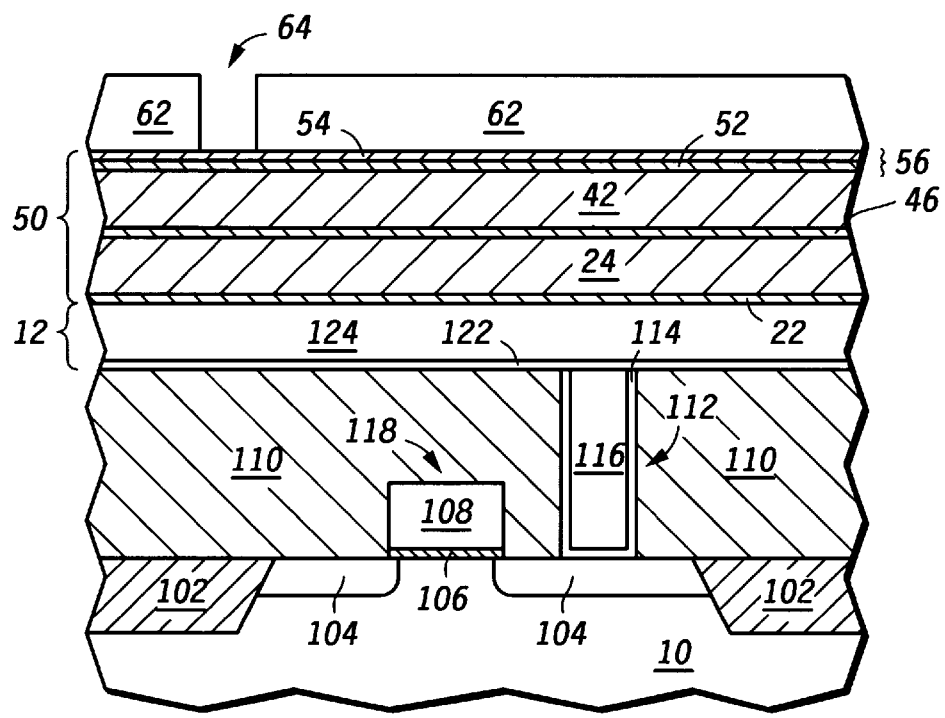
FIG. 6 includes an illustration of a cross-sectional view of the substrate of FIG. 5 after forming a resist layer with a via opening defined.
Figure 7:
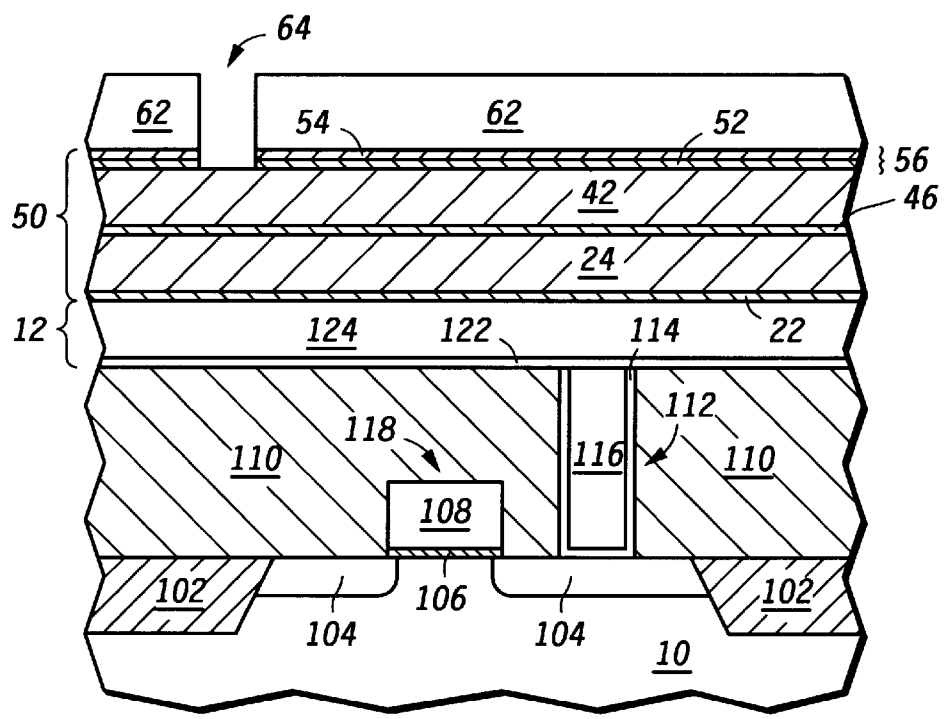
FIG. 7 includes an illustration of a cross-sectional view of the substrate of FIG. 6 after forming an opening through the third hardmask film.

In FIG. 6, a resist layer 62 is coated over the hardmask film 56 and patterned to form a resist via opening 64. This resist via opening 64 exposes a portion of the upper hardmask film 56. The substrate 10 is then etched to form an opening through hardmask film 56. Common etch chemistries and parameters are used to etch through hardmask film 56. The upper film 54 is etched using a polysilicon etch chemistry with minimal erosion of resist opening 64. After removing the upper film 54, the resist is stripped and exposed portions of the lower film 52 are then etched using a conventional oxide etch chemistry FIG. 7.

Typically, removal of the upper film 54, and the lower film 52, is performed in separate etch chambers. However, this is not a requirement for removal of the hardmask layer 56. The lower film 52, which is generally thicker than the upper film 54, is usually a primary consideration when etching through the hardmask film 56. Therefore, in an alternate embodiment, an oxide etch process which incorporates a fluorine-rich, low-selectivity etch step to remove the upper film 54, and then uses a conventional oxide chemistry to remove the lower film 52, can also be incorporated to remove the hardmask film 56.

Figure 8:
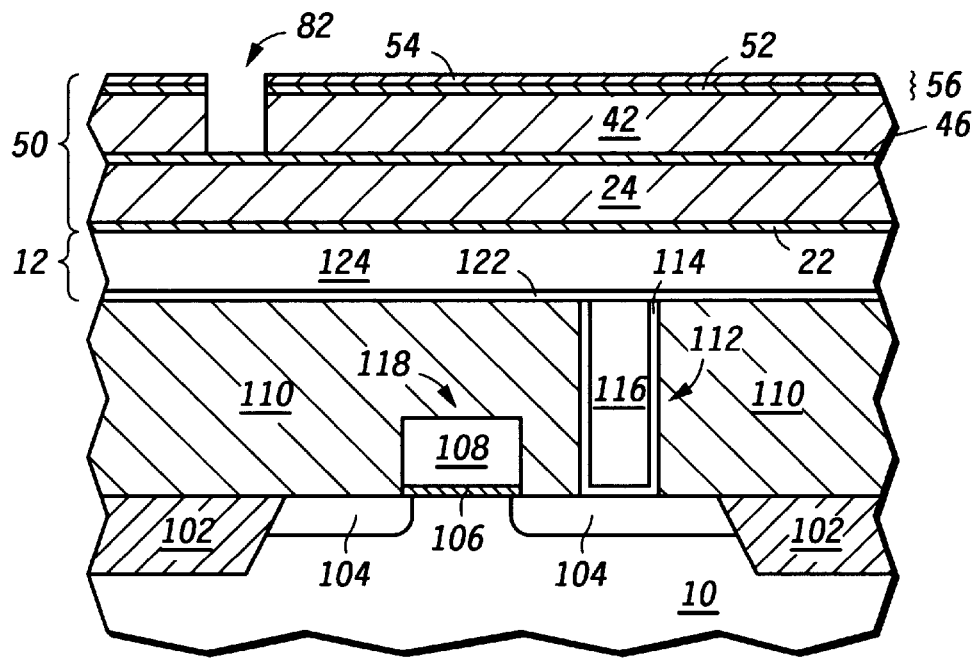
FIG. 8 includes an illustration of a cross-sectional view of the substrate of FIG. 7 after forming a via opening in accordance with one embodiment of the present invention.

After etching through the lower film 52, portions of the second low-k dielectric film 42 are removed to form a via pattern opening 82 as shown in FIG. 8. The etchant is an oxygen-containing plasma and the etching process is performed at a pressure in a range of approximately 1–10 millitorr, and at a radio frequency (RF) power in a range of approximately 100–400 watts, depending on the type of etching reactor used. All other etching parameters are conventional. During this processing step, the resist layer 62 is completely removed before terminating the etch. In one embodiment, oxygen is the only etching species. In other embodiments, at least one fluorine-containing gas is used if film 42 includes silicon atoms. The etch step is timed so as to stop on or within the intermediate etch stop film 46. Alternatively, termination of the etch processing step is determined using an endpoint detection system.

Figure 9:
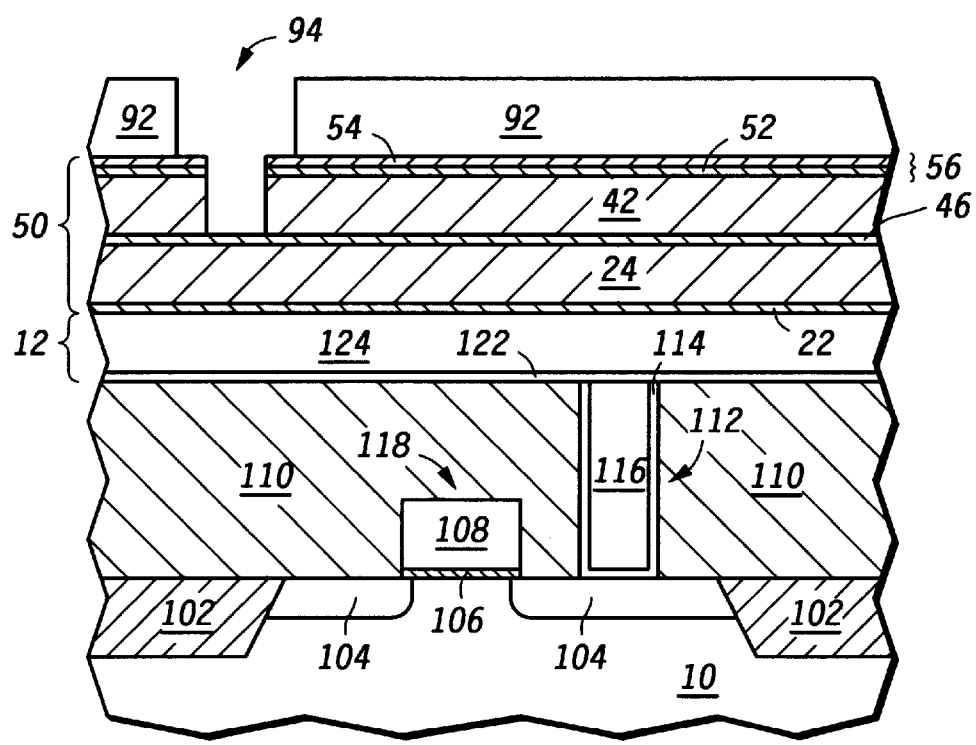
FIG. 9 includes an illustration of a cross-sectional view of the substrate of FIG. 8 after forming a resist layer with a an interconnect trench opening defined.
Figure 10:
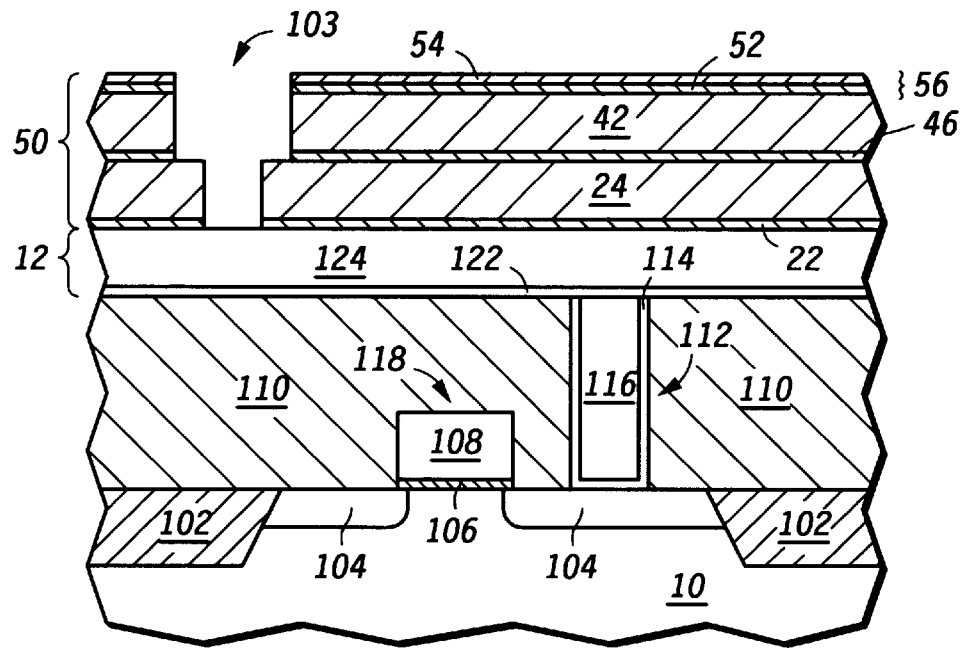
FIG. 10 includes an illustration of a cross-sectional view of the substrate of FIG. 9 after forming a dual inlaid opening in accordance with an embodiment of the present invention.

In FIG. 9, another resist layer 92 is formed and patterned over the upper film 54. The resist layer 92 has a resist opening 94 that corresponds to the interconnect channel that will be patterned within the second low-k dielectric film 42. The substrate 10 is etched to remove exposed portions of the hardmask film 56, the intermediate etch stop film 46, and portions of the low-k dielectric film 24 and low-k dielectric film 42, to form the opening 103 as illustrated in FIG. 10. The etching steps are substantially the same as for forming the resist via opening 92 previously described. In one embodiment, in accordance with the present invention, the resist layer 92 is removed while etching the low-k dielectric films 24 and 42. This is accomplished because the etchant used to remove the low-k dielectric films is an oxygen-containing plasma that readily removes the photoresist. A final hardmask etch is then employed to open the bottom etch stop film 22 to expose the second conductive film 124. Upon completion of the etch to form opening 103, the resist layer 92 is completely removed and the opening 103 is completely formed.

Figure 11:
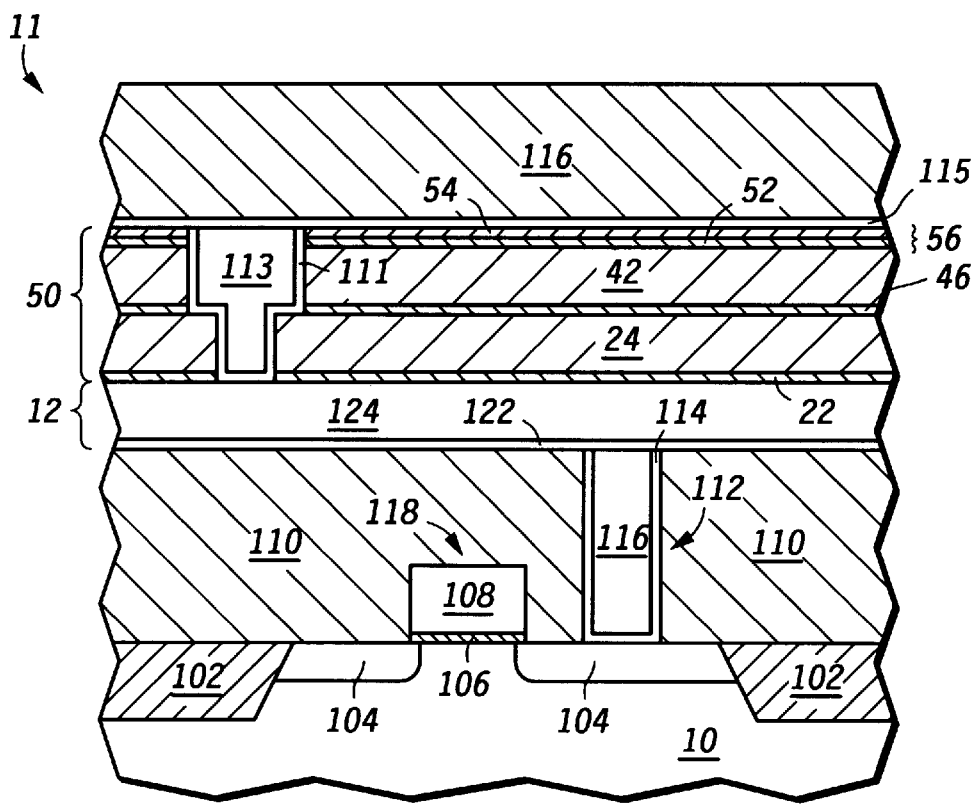
FIG. 11 includes an illustration of a cross-sectional view of the substrate of FIG. 10 after forming a substantially completed device.

In FIG. 11, an adhesion/barrier layer 111 is then formed within dual inlaid opening 103. In one embodiment, adhesion/barrier layer 111 is a layer of tantalum nitride. Alternatively, adhesion/barrier layer 111 may be a layer of titanium nitride, a layer of tungsten nitride, a layer of tantalum silicon nitride, a layer of tantalum, a titanium-tungsten layer, or the like. Adhesion/barrier layer 111 may be deposited using conventional sputtering or chemical vapor deposition techniques. A seed layer (not shown in FIG. 11) is formed overlying adhesion/barrier layer 111 using conventional deposition techniques. A conductive metal layer is then formed overlying the conductive seed layer. The conductive metal layer has a thickness that is sufficient to fill dual inlaid opening 103. In one embodiment, the conductive layer is a layer of copper which is deposited using an electroplating solution comprising copper (Cu), copper sulfate ($Cu_2SO_4$), sulfuric acid ($H_2SO_4$), and chloride ions, such as those from hydrochloric acid (HCl). Alternatively, the conductive metal layer may be formed using alternate techniques including electroless plating, chemical vapor deposition (CVD), or physical vapor deposition (PVD).

Portions of the conductive metal layer, seed layer and adhesion/barrier layer 111 are removed to form an interconnect 113 within the dual inlaid openings 103, wherein the conductive interconnect comprises remaining portions of the conductive metal layer, the seed layer, and the adhesion/barrier layer 111. The conductive interconnect 113 may be formed using a chemical mechanical polishing process. In one embodiment, the chemical mechanical polishing process uses a polishing slurry comprising hydrogen peroxide, ammonium citrate, alumina, 1,2,4-triazole, and deionized water. Alternatively, the conductive interconnect 113 may be formed using conventional etching techniques, such as ion-beam milling, reactive ion-beam etching, and plasma etching, or using a combination of etching and polishing techniques.

A barrier layer 115 is then formed overlying the conductive interconnects 113. In one embodiment, barrier layer 115 is a layer of plasma deposited silicon nitride. Alternatively, barrier layer 115 may be a layer of plasma deposited silicon oxynitride, a layer of boron nitride or the like. The barrier layer 115 is used to reduce the likelihood of metal atoms within conductive interconnect 113 from diffusing into dielectric layers which are subsequently deposited over conductive interconnect 113.

A passivation layer 116 is then formed over the interconnect structure. At this point, a substantially completed device 11 has been formed. Other electrical connections are made but are not shown in FIG. 11. Also, other ILD layers and interconnect levels may be used as needed if a more complicated device is formed.

The embodiments of the present invention may be changed as necessary in order to properly apply the concepts discussed above to other processing sequences required by other ILD materials. For example, in forming the ILD layer 50, it may be advantageous to cure the low-k dielectric film 24 immediately after its formation, or immediately after the formation of the organosilicon film 32. In one embodiment for example, a partial curing of film(s) 24 or 32, similar to a "soft bake," may be performed to give structural rigidity to these lower films within the ILD layer 50. Near the end, a more aggressive curing is performed which not only cures the layers, but also helps promote cross linking of the films to form an ILD layer 50 which is less susceptible to delamination during subsequent processing operations. The conditions required for the thermal processing and curing of the films that form the ILD layer 50 will often be determined by the properties of the films used to form the ILD layer 50. Those of ordinary skill in the art are capable of determining appropriate temperature curing schemes for the substrate in order to achieve acceptable properties from both a structural standpoint, such as adhesion and stress control, and from an electrical standpoint, such as leakage current.

In other alternate embodiments, the hardmask 56 layer may be removed during the later stages of forming the interconnect structure including after formation of conductive interconnect 113. In this case, if amorphous silicon is used for the upper film 54, it is easily removed during the polish step. Upon exposure of the lower film 52, a higher substrate down force pressure may be used during the polishing step to remove the lower film 52. In any event, if the top hardmask film can be removed, advantages will accrue to users as there will now be less high-k material present within the device.

Embodiments of the present invention include many benefits. First, embodiments of the present invention allow the use of an intermediate etch stop film that does not have a high dielectric constant, such as a silicon nitride or silicon oxynitride compound. Because the film is an oxide-like film, it has a lower dielectric constant as compared to a nitrogen-containing film. Additionally, this process can be integrated such that the steps for forming the low-k dielectric films 24 and 42, and the heating step to form the intermediate etch stop film 46, can all be performed on a single processing platform, for example a coat track system. Currently, hot plates and ovens are commercially available that can be configured into a coat track system allowing for easy process integration of the curing operation. Additionally, using coat track systems to form the films provides better thickness control as compared to chemical vapor depositions, which tend to be less uniform across the surface of the wafer. Significant reductions in overall processing time as well as cost of ownership are expected as a result using embodiments of the present invention. Further, the process can be used without having to develop marginal processing steps or creating exotic materials that are not currently available.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

What is claimed is:

1. A method of forming a semiconductor device comprising:
   forming a first dielectric film over a substrate, wherein the first dielectric film includes a low-k dielectric;
   forming a second dielectric film over the substrate;
   thermally processing the substrate to convert a portion of the second dielectric film to polysiloxane;
   curing the substrate to at least partially change a property of the second dielectric film;
   forming a third dielectric film over the substrate, wherein the third dielectric film includes a low-k dielectric; and
   etching the substrate, wherein the second dielectric film serves as an etch stop.

2. The method of claim 1, wherein each of the first dielectric film and the third dielectric film have a dielectric constant that is less than approximately 3.5.

3. The method of claim 1, wherein forming the first dielectric film is performed using a spin-on coating process.

4. The method of claim 1, wherein:
   curing changes the second dielectric film at an interface between the first dielectric film and the second dielectric film to form a silicon oxide having a molecular composition SiOxRy, where x is equal to or greater than one, and y is equal to or greater than zero.

5. The method of claim 1, wherein a thickness of the second dielectric film is in a range of approximately 5–200 nanometers.

6. The method of claim 1, wherein a thickness of the second dielectric film is in a range of approximately 15–60 nanometers.

7. The method of claim 1, wherein forming the first dielectric film further comprises curing the first dielectric film before forming the second dielectric film.

8. The method of claim 1, wherein forming the first dielectric film, forming the second dielectric film, and curing are performed on a single processing platform.

9. The method of claim 1, wherein forming the first dielectric film, forming the second dielectric film, forming the third dielectric film, and curing are performed on a single processing platform.

10. The method of claim 1, wherein forming the third dielectric film is performed after curing the second dielectric film.

11. The method of claim 1, wherein forming the third dielectric film is performed before curing the second dielectric film.

12. The method of claim 1, further comprising the steps of:
   forming an interconnect layer over the substrate; and
   forming a passivation layer over the interconnect layer.

13. The method of claim 1, wherein:
   the second dielectric film comprises a silicon-containing oxide material having a dielectric constant less than approximately 3.5; and,
   the first and third dielectric films comprise a carbon-based material, and have a dielectric constant that is less than approximately 3.5.

14. The method of claim 1, wherein:
   the second dielectric film comprises a carbon-based material having a dielectric constant that is less than approximately 3.5.

15. A method of forming a semiconductor device comprising:
   forming a first dielectric film over a substrate;
   forming a second dielectric film over the substrate;
   curing the substrate to at least partially change a property of the second dielectric film;
   forming a third dielectric film over the substrate;
   forming a multilayer hardmask film over the third dielectric film, wherein the multilayer hard mask film comprises a first layer and a second layer, which is thicker than the first layer; and
   etching the substrate, wherein the second dielectric film serves as an etch stop.

16. The method of claim 15, wherein each of the first and second layers includes silicon and wherein the first and second layers have a different composition.

17. The method of claim 15, wherein the first layer includes fluorinated silicon oxide.

18. The method of claim 17, wherein forming the multilayer hardmask film comprises forming a silicon layer.

19. The method of claim 15, wherein the first layer includes silicon and nitrogen.

20. The method of claim 15, wherein forming the multilayer hardmask film comprises forming a silicon layer.

21. The method of claim 1 wherein thermally processing the substrate is further defined as thermally processing the substrate in the range of approximately 250 to 350 degrees Celsius.

* * * * *